United States Patent
Sheldon et al.

(10) Patent No.: US 9,356,183 B1
(45) Date of Patent: May 31, 2016

(54) OPTOELECTRONIC DEVICE WITH ENHANCED EFFICIENCY AND METHOD OF USE

(75) Inventors: Matthew Sheldon, Los Angeles, CA (US); Carissa N. Eisler, Santa Clarita, CA (US); Harry A. Atwater, South Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 815 days.

(21) Appl. No.: 13/528,721

(22) Filed: Jun. 20, 2012

Related U.S. Application Data

(60) Provisional application No. 61/499,062, filed on Jun. 20, 2011.

(51) Int. Cl.
*B82Y 30/00* (2011.01)
*H01L 21/314* (2006.01)
*H01L 31/0216* (2014.01)
*H01L 31/18* (2006.01)

(52) U.S. Cl.
CPC ............ *H01L 31/1868* (2013.01); *H01L 31/18* (2013.01); *H01L 31/0216* (2013.01); *H01L 31/02167* (2013.01)

(58) Field of Classification Search
CPC .............. H01L 31/02167; H01L 31/18; H01L 31/1868; H01L 21/314; H01L 31/0216; B82Y 30/00; Y02E 10/50
See application file for complete search history.

(56) References Cited

U.S. PATENT DOCUMENTS

| | | | | |
|---|---|---|---|---|
| 4,751,201 A | * | 6/1988 | Nottenburg et al. | 438/93 |
| 6,906,339 B2 | * | 6/2005 | Dutta | 257/40 |

* cited by examiner

*Primary Examiner* — Jayne Mershon
*Assistant Examiner* — Mayla Gonzalez Ramos
(74) *Attorney, Agent, or Firm* — Sawyer Law Group, P.C.

(57) ABSTRACT

A compound III/V optoelectronic device and method associated with such a device is disclosed. In one aspect, a method for an improved III/V compound optoelectronic device is disclosed. The method comprises applying a sulfur surfactant on the III/V compound optoelectronic device to improve passivation of the III/V compound optoelectronic device. In a second aspect, a III/V compound optoelectronic device is disclosed. The III/V compound optoelectronic device comprises a thin film device with a III/V compound semiconductor absorbing material, and a sulfur surfactant on the III/V compound thin film device to improve passivation of the III/V compound optoelectronic device.

5 Claims, 3 Drawing Sheets

OPTOELECTRONIC DEVICE WITH ENHANCED EFFICIENCY AND METHOD OF USE

CROSS-REFERENCE TO RELATED APPLICATION

This application claims the benefit of U.S. Provisional Patent Application No. 61/499,062, filed on Jun. 20, 2011, entitled "GaAs SURFACE PASSIVATION USING SULFUR AND SELENIUM FUNCTIONALIZED SURFACTANTS," which is incorporated herein by reference in its entirety.

STATEMENT REGARDING FEDERALLY SPONSORED RESEARCH

This invention was made with government support under Grant No. W911 NF-10-1-0417 awarded by ARO-US Army Robert Morris Acquisition Center. The government has certain rights in the invention.

FIELD OF THE INVENTION

The present invention relates generally to optoelectronic devices and more specifically to a method and system for improving the efficiency thereof.

BACKGROUND

III/V compound semiconductors are the foundational materials for the highest efficiency optoelectronic devices such as solar cells. What is meant by III/V compound semiconductors are epitaxially grown layers which contain at least one group III element and at least one group V element, for example gallium arsenide, aluminum gallium arsenide, aluminum gallium indium phosphide, indium gallium phosphide, aluminum indium phosphide, gallium aluminum phosphide, or combinations thereof. Furthermore, the use of such semiconductors in small cell networks improves durability and also allows for flexibility.

The problem to be solved in the field of optoelectronic devices is that there is increased surface recombination at the sidewalls, which lowers device efficiency. Accordingly, there is a need for a system and method that overcomes the above problem. The present invention is the solution.

SUMMARY OF THE INVENTION

A compound III/V optoelectronic device and method associated with such a device is disclosed. In one aspect, a method for an improved III/V compound optoelectronic device is disclosed. The method comprises applying a sulfur surfactant on the III/V compound optoelectronic device to improve passivation of the III/V compound optoelectronic device.

In a second aspect, a III/V compound optoelectronic device is disclosed. The III/V compound optoelectronic device comprises a thin film device with a III/V compound semiconductor absorbing material, and a sulfur surfactant on the III/V compound thin film device to improve passivation of the III/V compound optoelectronic device.

Other aspects and advantages of the present invention will become apparent from the following detailed description, taken in conjunction with the accompanying drawings, illustrating by way of example the principles of the invention.

DETAILED DESCRIPTION

Figure 1:
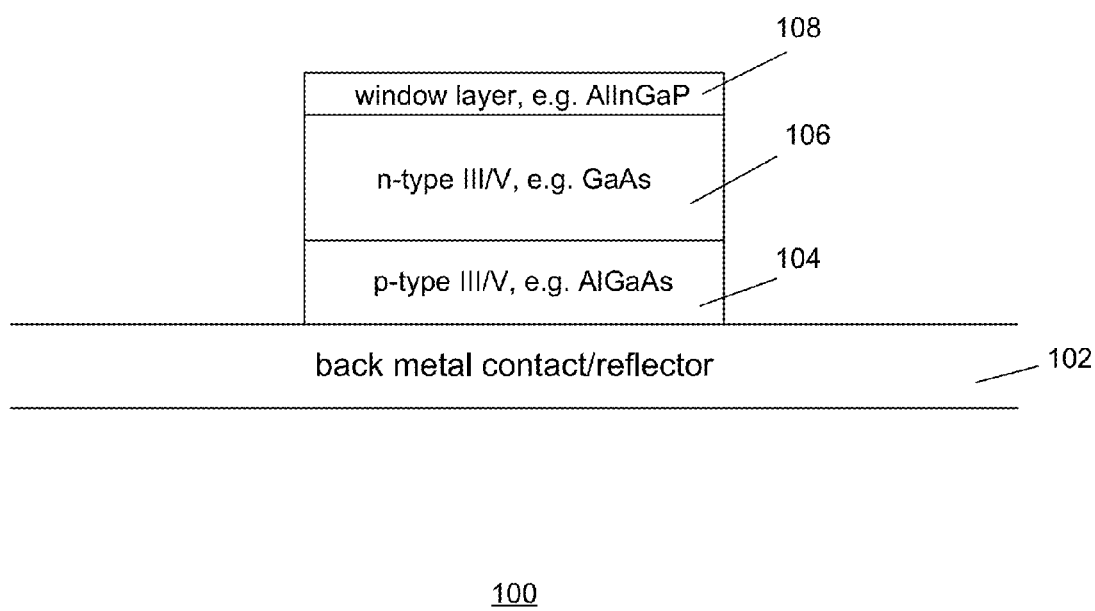
FIG. 1 illustrates a thin film optoelectronic device in accordance with an embodiment.

The present invention relates generally to optoelectronic devices and more specifically to a method and system for improving the efficiency thereof. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

A key aspect of high efficiency optoelectronic devices is the passivation of compound semiconductor surfaces to mitigate recombination of photogenerated carriers. This design enables optoelectronic devices with high open circuit voltages and quantum efficiencies. Surface passivation of compound semiconductor solar cells is usually accomplished by growth of thin epitaxial heterostructure window layers that confine photogenerated electrons and holes away from the front and rear surfaces of the cell, suppressing minority carrier recombination. Typically the lateral edges of large ($\gg 1$ cm$^2$) solar cells are not passivated, and while they act as locations for minority carrier recombination, the affected regions comprise a small fraction ($\ll 1\%$) of the cell surface area, and thus do not significantly compromise cell efficiency.

There has been growing interest in the design of small ($<1$ cm$^2$) III/V thin film solar cells for microconcentrator cell applications because higher efficiencies are attainable with less semiconductor material. In this size regime, carrier recombination at edges can play a significant role in device performance. Moreover, thin film GaAs solar cells of any size fabricated in flexible sheets can exhibit cracking, for example if tensile and/or compressive stresses are applied to the solar cell during operational service. The cracks create new edge regions that increase carrier recombination.

While crack formation can be mitigated or eliminated by immobilizing a cell on a support structure, this strategy restricts devices to rigid rather than flexible photovoltaic modules, limits suitable installation environments, and does not protect the cell from degradation due to impacts, among other things. An alternative strategy for the realization of robust flexible modules is for example to effectively 'pre-crack' devices by parallel wiring fault-tolerant networks of small cells, each on the order of less than 1 mm$^2$ active area, and encasing the network in a flexible elastomer. Although this minimizes the risk from further damage after fabrication, the technique still introduces numerous lateral edges that cannot be passivated by window layers fabricated via planar epitaxial growth. For either strategy, lower device efficiency results due to the increase in unpassivated semiconductor surface area associated with cell edges.

In a system and method in accordance with the present invention long-chain sulfur surfactant molecules are utilized for III/V compound passivation. To describe this in more detail refer now to the following discussion in combination with the accompanying figures.

FIG. 1 illustrates a thin film III/V compound optoelectronic device 100 in accordance with an embodiment. The device 100 includes a back metal contact reflector 102, p-type III/V compound layer 104 on top of the reflector 102, and an n-type III/V compound layer 106 on top of the p-type III/V compound 104. In an embodiment, the layer 104 is AlGaAs and the layer 106 is GaAs. The layers 104 and 106 form a heterojunction. A window layer 108 is situated on top of the layer 106. The device for example can be utilized as a thin film solar cell.

One of ordinary skill in the art readily recognizes a variety of materials listed and shown could differ from the examples listed and shown herein. There may be additional layers in structure 100, in addition to those shown in FIG. 1. Furthermore, the pn junction formed in structure 100 could be a homojunction or a heterojunction that is, both the n-type layer 104 and p-type layer 106 could be the same material, or could be different materials, and that would be within the spirit and scope of the present invention. Also the doping could be inverted, with p-type material at the top of the device, facing the sun, and n-type material at the bottom. One or more additional pn structures could be added to structure 100 in a similar fashion, either above or below structure 100, and possibly coupled to the rest of the device through a tunnel junction layer or layers.

Figure 2:
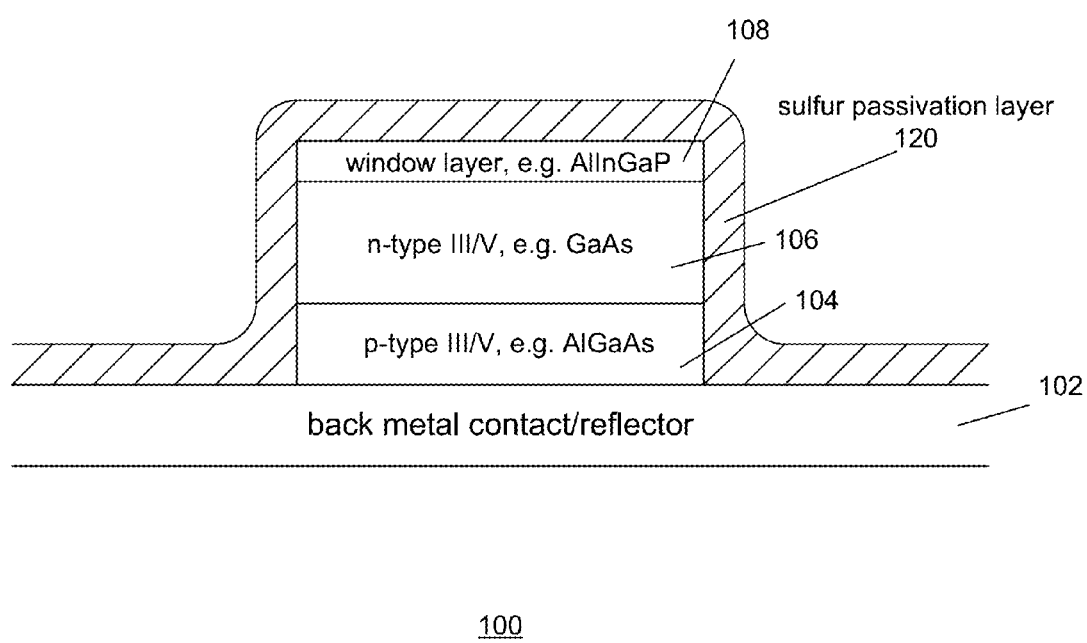
FIG. 2 illustrates the thin film optoelectronic device of FIG. 1 including the sulfur surfactant layer.

FIG. 2 illustrates the device 100 that includes a sulfur surfactant layer 120 thereover. The sulfur surfactant layer 120, often formed from detergents, features easily modified functional groups that can be tailored for specific semiconductor surface chemistries. Bulky aliphatic chains limit interaction to a surface monolayer and inhibit etching of the surface while providing increased resistance to oxidation. In nanocrystals this type of surface treatment also facilitates high photoluminescence quantum efficiency (PL QE), near unity in some cases, indicating excellent passivation of surface carrier traps despite the extremely large relative surface area of these materials.

Specifically, a sulfur surfactant trioctylphosphine sulfide (TOP:S), SP(C8H17)3, a ubiquitous surfactant in the nanocrystal community has been identified, and employed to improve the edge passivation of for example GaAs solar cells. TOP:S is an inert, transparent, and insulating viscous liquid with sulfur in a −2 oxidation state. An enhanced photoluminescence yield has been observed when TOP:S passivated the GaAs (011) crystal plane facets of a cleaved GaAs (100) crystal plane substrate, verifying that the surfactant substantially improves the electronic quality of the 011 cell surface. The TOP:S liquid was also applied to pre-fabricated thin film GaAs solar cells and decreased the edge recombination current by about 80%, eliminating size-dependent efficiency losses for cells with active areas as small as 1 mm$^2$. Finally, when applied at the surface of GaAs (011) crystal plane edges created by fracturing a GaAs (100) crystal plane thin film cell, TOP:S decreased the surface recombination velocity of the GaAs (011) crystal plane edge by an order of magnitude, significantly increasing the collected photocurrent near a crack in the solar cell. Thus TOP:S is an excellent candidate for both the reduction of sidewall carrier recombination and passivation of damage, enabling improved performance and longevity from high efficiency GaAs.

Self-Healing Encapsulation

Figure 3:
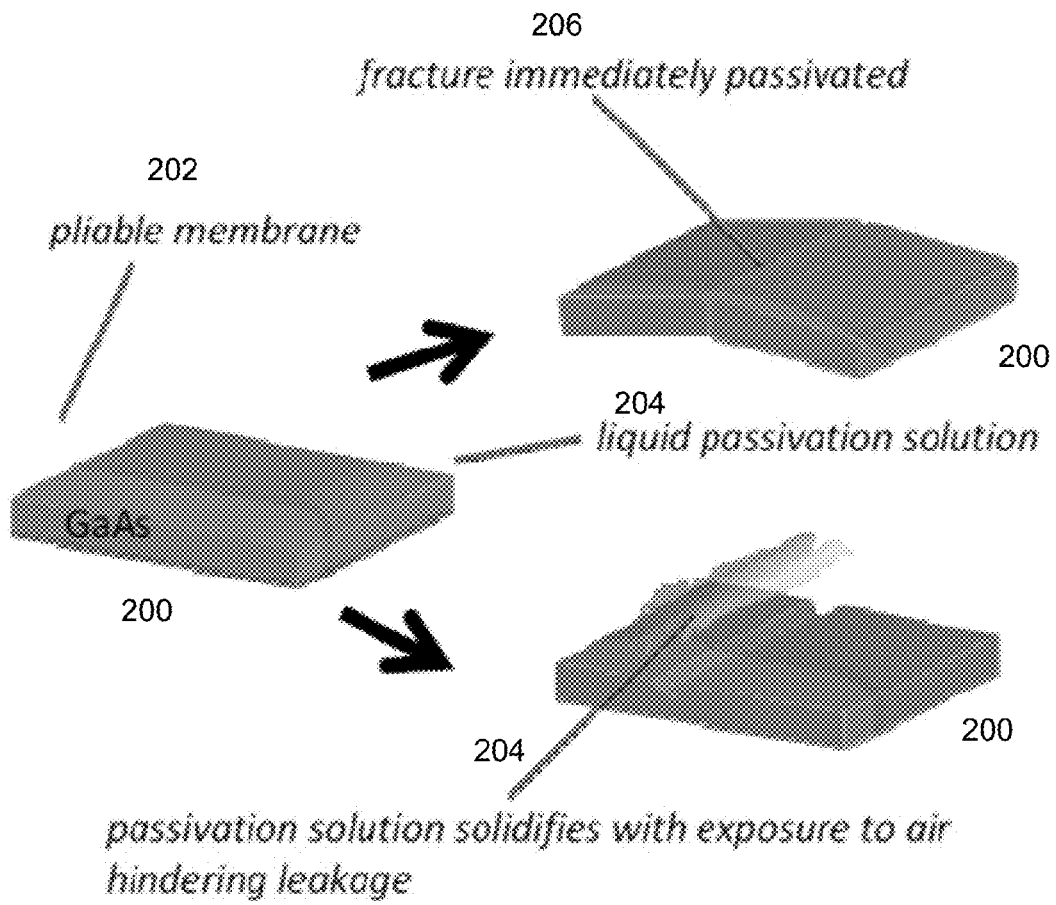
FIG. 3 illustrates a thin film optoelectronic device that includes a layer of surfactant for self-healing.

The sulfur surfactant can also be utilized in a self-healing manner. FIG. 3 illustrates a thin film optoelectronic device 200, which includes a layer of surfactant for self-healing. When providing a thin film cell, a pliable membrane 200 is provided thereon containing a sulfur surfactant solution 204. If there is a fracture 206, immediate passivation occurs at exposed surface by releasing the solution. If a puncture occurs exposure to oxygen locally solidifies the sulfur surfactant solution 204, thereby preventing leakage of passivation liquid.

CONCLUSION

A system and method in accordance with the present invention, allows for the application of a sulfur surfactant such as TOP:S to substantially improve sidewall passivation in high efficiency optoelectronic device. Because unpassivated facets are a source of efficiency loss in small cells or cells that have been fractured, this treatment will serve to mitigate efficiency losses in damaged optoelectronic devices, and improve photovoltaic module robustness. Surfactants such as these can provide passivation approaching the quality of conventional inorganic epitaxial window layers. This will enable high efficiency photovoltaic systems comprised of small optoelectronic devices and would eventually enable 'self-healing' cells, in which an encapsulated passivation liquid is released when damage occurs.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for an improved III/V optoelectronic device comprising:
    applying a sulfur surfactant to exposed edges of the III/V optoelectronic device to improve passivation of the III/V optoelectronic device;
    wherein the exposed edges are created by cracks in, or intentional fracturing of, the III/V optoelectronic device.

2. The method of claim 1 wherein the sulfur surfactant comprises an inert, transparent and insulating viscous liquid with sulfur in a −2 oxidation state.

3. The method of claim 1, wherein the sulfur surfactant is applied to the front and/or rear surfaces of the III/V optoelectronic device.

4. The method of claim 1, wherein the cracks are formed after the surfactant is applied.

5. The method of claim 1, wherein the surfactant is trioctylphosphine sulfide (TOP:S), SP($C_8H_{17}$)$_3$.

* * * * *